(12) United States Patent
Ives (10) Patent No.: US 7,448,273 B2
(45) Date of Patent: Nov. 11, 2008

(54) EFFECTING DYNAMIC MEASUREMENT OF LOW MASS DEVICES

(75) Inventor: Thomas W. Ives, Boise, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 211 days.

(21) Appl. No.: 10/990,178

(22) Filed: Nov. 16, 2004

(65) Prior Publication Data

US 2006/0104164 A1 May 18, 2006

(51) Int. Cl.
*G01N 9/18* (2006.01)
*G11B 23/00* (2006.01)

(52) U.S. Cl. .................... 73/655; 369/258.1
(58) Field of Classification Search ............. 369/258.1, 369/44.15, 44.16, 126, 272.1, 287, 47.48, 369/256.1, 277.1; 428/694 SG; 73/655
See application file for complete search history.

(56) References Cited

U.S. PATENT DOCUMENTS

| | | | | |
|---|---|---|---|---|
| 3,420,597 A | * | 1/1969 | Schoonover et al. | 359/539 |
| 5,154,797 A | * | 10/1992 | Blomquist et al. | 216/12 |
| 5,264,063 A | * | 11/1993 | Martin | 156/247 |
| 5,940,364 A | * | 8/1999 | Ogata et al. | 369/275.4 |
| 6,139,158 A | * | 10/2000 | Nilsen et al. | 359/530 |
| 6,365,442 B1 | * | 4/2002 | Tran et al. | 438/128 |
| 6,436,588 B1 | * | 8/2002 | Mason et al. | 430/5 |
| 6,440,644 B1 | * | 8/2002 | Sato et al. | 430/322 |
| 6,812,617 B2 | * | 11/2004 | Ives | 310/309 |
| 6,914,871 B2 | * | 7/2005 | Hara et al. | 369/112.29 |
| 6,925,047 B2 | * | 8/2005 | Ives | 369/258.1 |
| 7,120,097 B1 | * | 10/2006 | Ha et al. | 369/47.48 |
| 2002/0110760 A1 | * | 8/2002 | Lin | 430/322 |
| 2003/0003326 A1 | * | 1/2003 | Iida et al. | 428/694 SG |
| 2005/0260527 A1 | * | 11/2005 | Lee, II | 430/311 |

* cited by examiner

*Primary Examiner*—Hezron E. Williams
*Assistant Examiner*—Jacques M. Saint-Surin (57) ABSTRACT

A low mass device is disclosed. The low mass device includes a body member defining a surface and a retroreflective pattern formed in the surface of the body member.

20 Claims, 8 Drawing Sheets

EFFECTING DYNAMIC MEASUREMENT OF LOW MASS DEVICES

FIELD

This invention relates generally to effecting dynamic measurement of low mass devices and, more particularly, to a low mass device, to a method of fabricating a low mass device and to a method of, and a system for, effecting dynamic measurement of a low mass device.

BACKGROUND

It is not currently possible to measure movement of a micro electromechanical systems (MEMS) device in-plane, i.e. in a plane of a wafer of the MEMS device. In the development of such MEMS devices it would be desirable to be able to determine dynamic characteristics of the MEMS device in-plane.

Normally a laser Doppler vibrometer (LDV) is used to measure movement of a MEMS device normal to the plane of the wafer. However, the LDV cannot be used to measure movement of the MEMS device in-plane as the LDV cannot measure at an angle to the MEMS device. This is partly due to the fact that the MEMS device has a reasonably smooth upper surface which cannot act as a retroreflector.

Due to the very small size of a MEMS device, retroreflective material, for example, retroreflective tape, cannot be applied to the surface of the MEMS device. The application of retroreflective tape to the MEMS device would significantly increase the weight of the MEMS device and any subsequent measurement of the movement of the MEMS device, whether in-plane or not, would be entirely meaningless.

SUMMARY

A low mass device is disclosed. The low mass device includes a body member defining a surface and a retroreflective pattern formed in the surface of the body member.

DETAILED DESCRIPTION OF EXEMPLARY EMBODIMENT

In this specification, unless the context clearly indicates otherwise, the term "low mass device" is to be understood as a device where the addition of any item to the device would adversely affect the mass of the device to such an extent that any subsequent measurement of the movement of the device would be rendered meaningless.

In FIGS. 1A-1D, reference numeral 100 generally designates a low mass device, as defined. The low mass device 100 is in the form of a microelectromechanical system (MEMS) memory storage device. For the sake of brevity, the device 100 will be referred to below as a "MEMS device".

The MEMS device 100 has a substantially planar body member in the form of a rotor 102. The rotor 102 defines an upper surface 104. The rotor 102 is bounded by a rotor frame 106 and the rotor 102 is connected to the rotor frame 106 by a pair of opposed mounts 108. The rotor 102 is further surrounded by a plurality of flexures 110. A pair of opposed coupling masses 112 are arranged along those sides of the rotor 102 substantially normal to the sides of the rotor 102 having the mounts 108.

As will be described in greater detail below, in testing the MEMS device 100 it is necessary to measure its dynamic characteristics, more particularly, the movement of the rotor 102 relative to the rotor frame 106. To enable such dynamic characteristics to be measured in a direction normal to a plane within which the surface 104 of the rotor 102 lies and in-plane, a retroreflective pattern 114 is etched into the surface 104. The retroreflective pattern 114 is shown in greater detail in FIGS. 1C and 1D of the drawings. More particularly, the retroreflective pattern 114 includes an array or matrix of pits 116. Each pit 116 is in the form of an inverted pyramid extending into the surface 104 of the rotor 102. It will be appreciated that, due to the angled faces of each pit 116, retro-reflection occurs.

Referring to FIGS. 2A-2E, in the fabrication of the MEMS device 100, a substrate 200 is provided. An upper surface of the substrate 200 is coated with a photo resist. A photolithographic mask 204 having a pattern 206 corresponding to the flexure mounts 108, the flexures 110 and the coupling masses 112 is applied to the surface 202 of the mask and is cured by exposure to ultraviolet radiation.

After curing, the mask 204 is removed and an etchant is applied. The etchant etches the substrate 200 to form the flexures 110, the flexure mounts 108 and the coupling masses 112. This forms the rotor 102 and the rotor frame 106 of the device 100.

To form the retroreflective pattern 114 on the surface 104 of the rotor 102, a photo resist is applied to an upper surface 208 of the etched substrate 200. A second photolithographic mask 210 is applied to the coated surface 208.

Figure 1A:
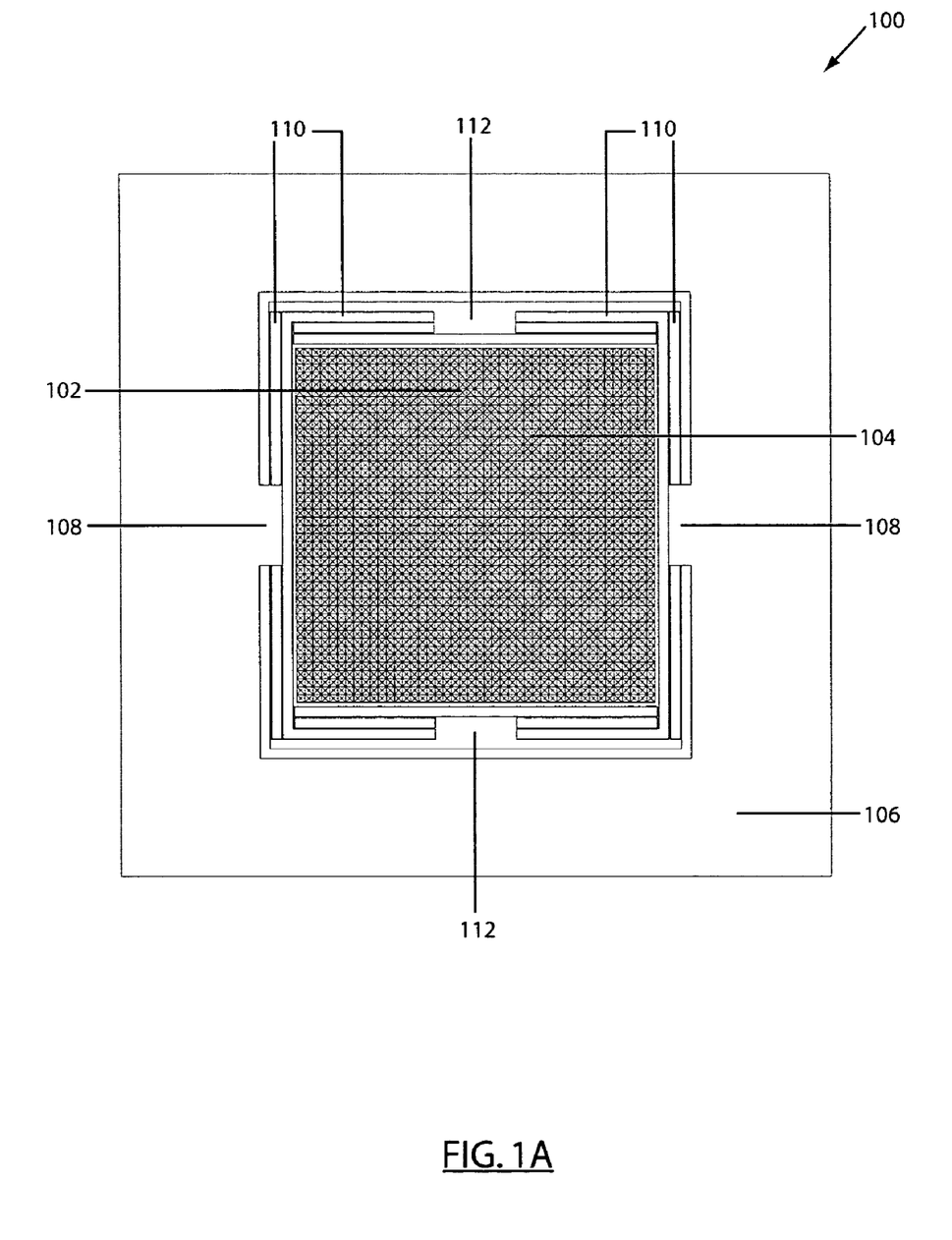
FIG. 1A shows a schematic plan view of a low mass device, in accordance with an embodiment of the invention.
Figure 1B:
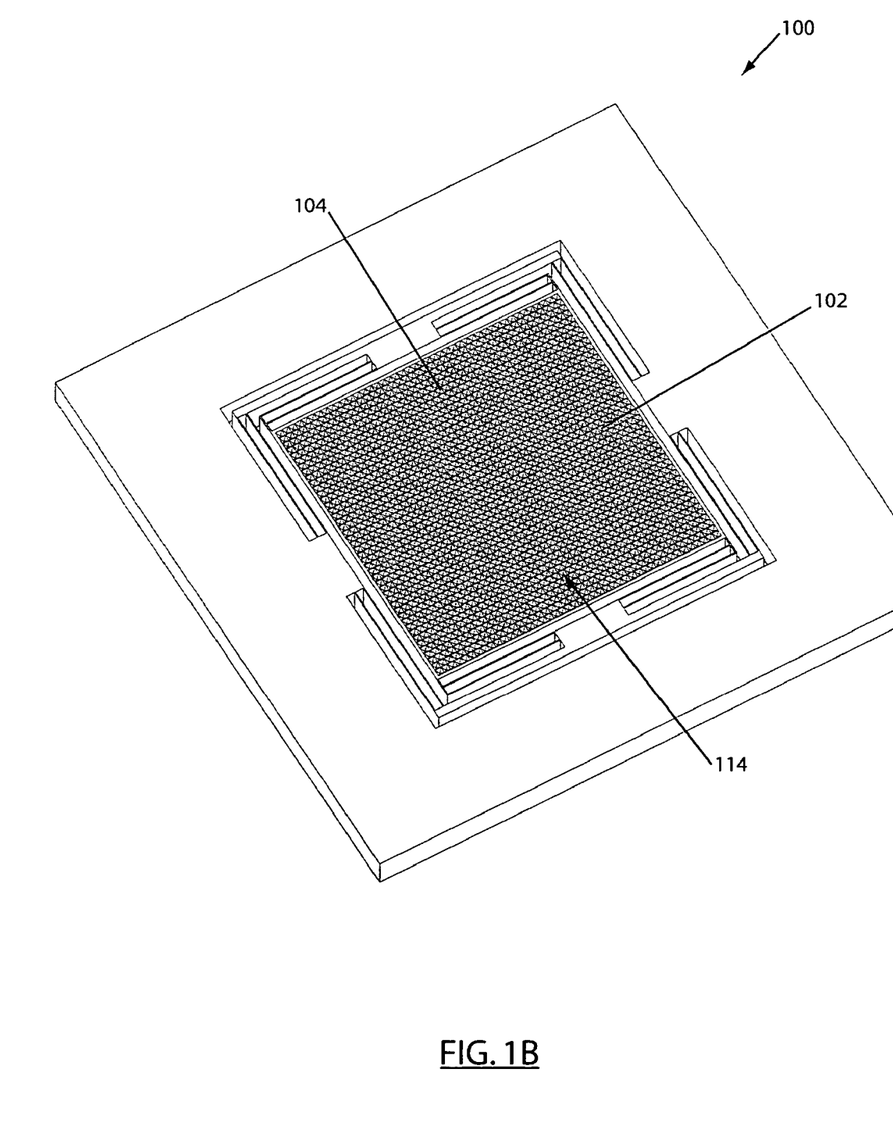
FIG. 1B shows a three dimensional view of the device of FIG. 1A.
Figure 1C:
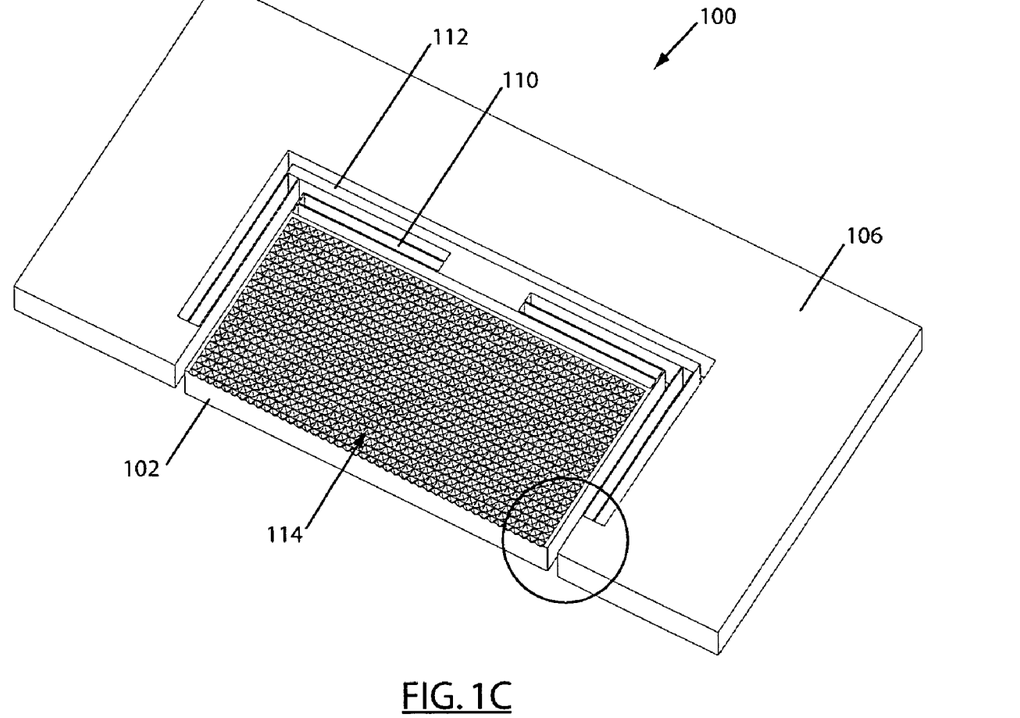
FIG. 1C shows a three dimensional view of part of the device of FIG. 1A.
Figure 1D:
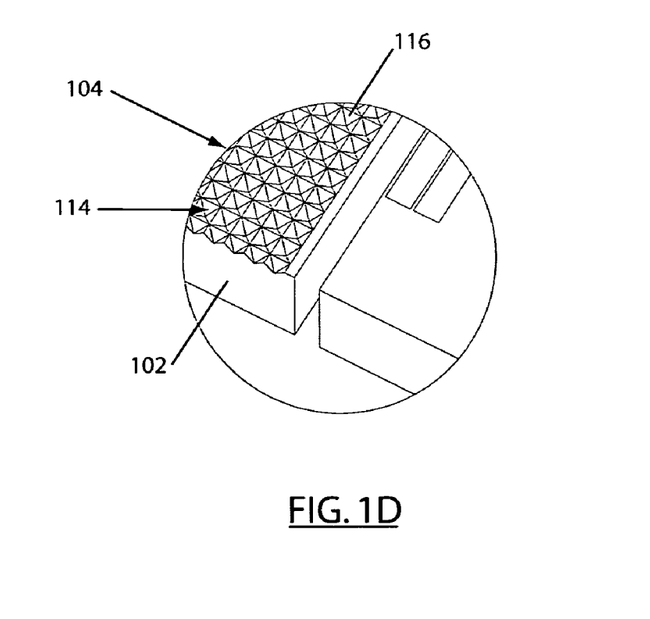
FIG. 1D shows, on an enlarged scale, the encircled part of FIG. 1C.
Figure 2A:
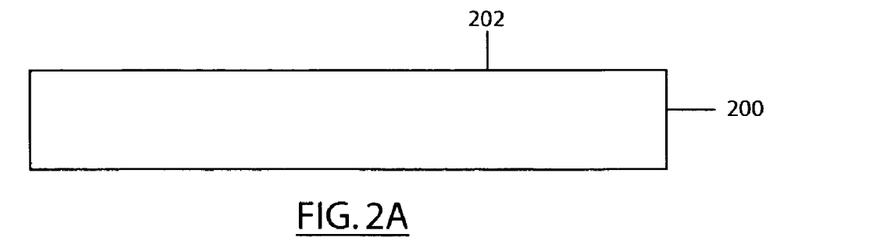
FIGS. 2A-2E show various steps in the fabrication of a low mass device, in accordance with an embodiment of the invention.
Figure 2B:
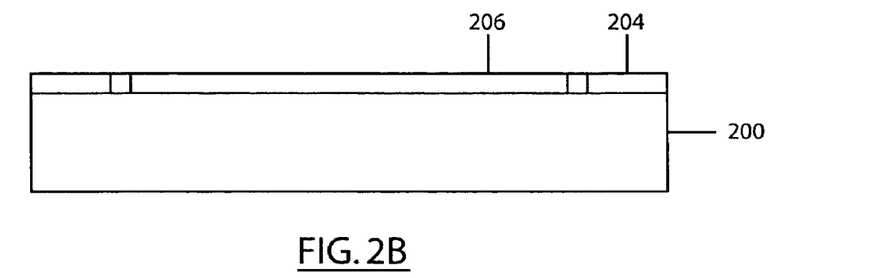
Figure 2C:
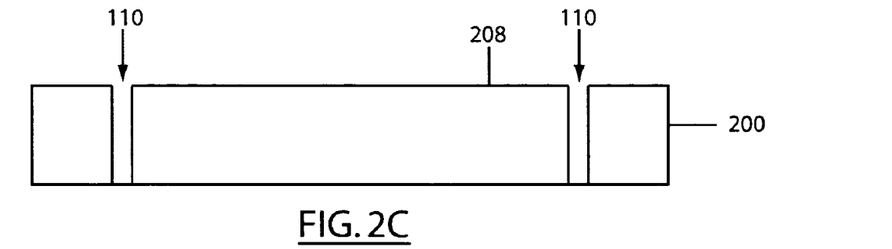
Figure 2D:
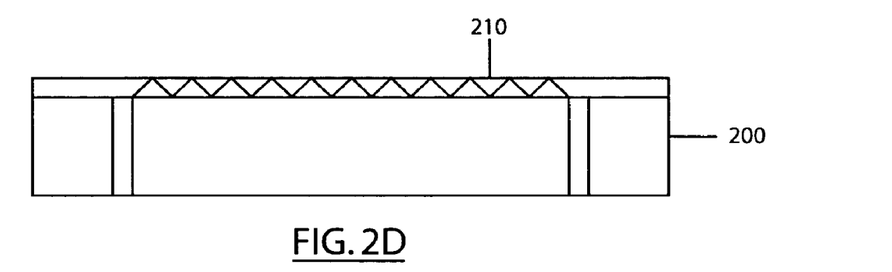
Figure 2E:
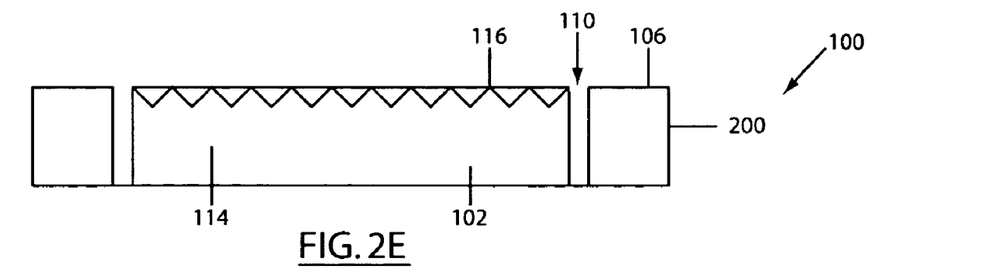
Figure 3A:
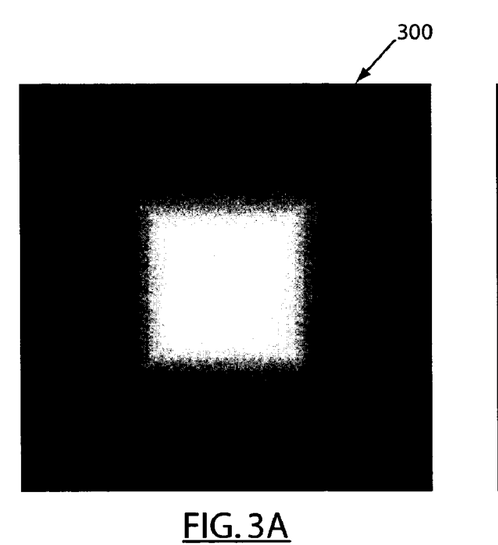
FIGS. 3A-3C show variations of a first type of mask used in the fabrication of the device.
Figure 3B:
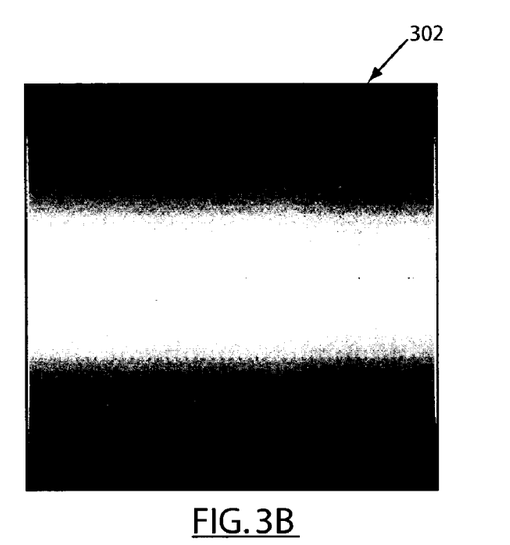
Figure 3C:
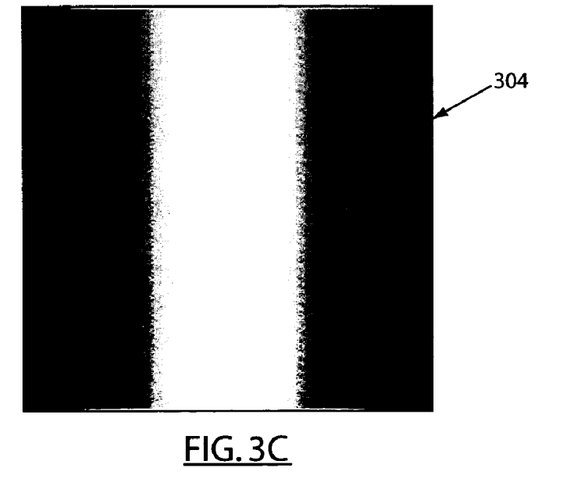
Figure 4:
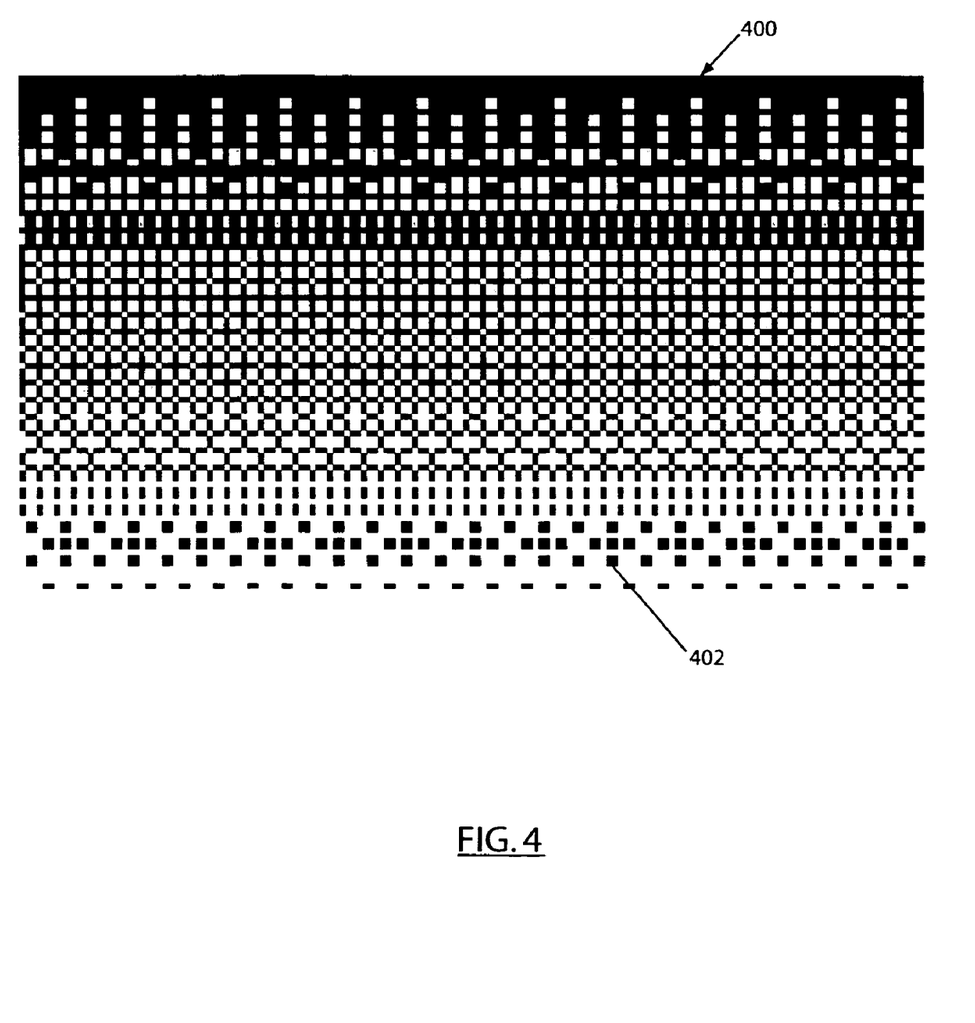
FIG. 4 shows a schematic, sectional side view of part of another variation of a mask used in the fabrication of the device.

The mask 210 can be made in one of two ways. The mask 210 could be made up of one or more of a number of gray scale patterns 300, 302 or 304 as shown in FIGS. 3A-3C of the drawings. These gray scale patterns 300-304 form the part of the mask 210 used to create the retroreflective pattern 114 on the surface 104 of the rotor 102. Alternatively, the photolithographic mask 210 could be made up of a plurality of variable density dot fields 400 (FIG. 4) made up of a plurality of equally darkened or clear small dots 402 arranged in a variable density to form the pattern to be etched.

Irrespective of the manner of forming the mask 210, the mask 210 is applied over the photo resist and the photo resist is cured by exposure to ultraviolet radiation. Upon completion of curing, the mask 210 is removed and the exposed surface 208 is etched. In an embodiment, etching of the surface 208 results in the formation of grooves with walls angled at 45° wherein the grooves extend orthogonally across the surface 208 to form the pyramid-shaped pits 116.

Figure 5:
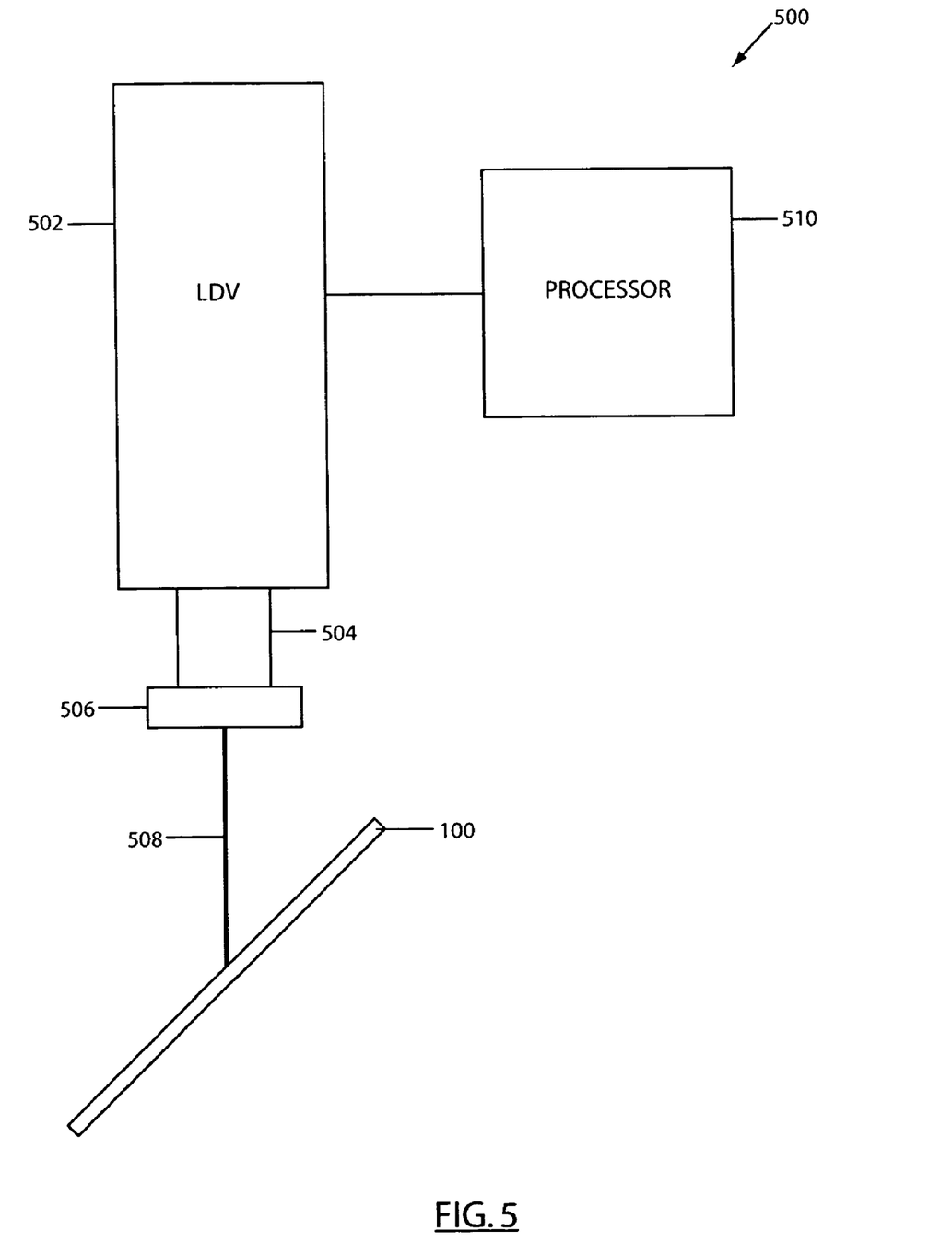
FIG. 5 shows a schematic, block diagram of a system, in accordance with an embodiment of the invention, for effecting dynamic measurement of a low mass device.

Referring to FIG. 5 of the drawings, a system 500 for measuring dynamic movement of the rotor 102 of the MEMS device 100 includes a laser beam generator in the form of a laser Doppler vibrometer (LDV) 502. The LDV 502 outputs a laser beam 504. Because of the very small size of the MEMS device 100, it is necessary to focus the laser beam 504. For this purpose, a focusing instrument in the form of a microscope 506 is interposed between the LDV 502 and the MEMS device 100, the movement of which is to be measured. The microscope 506 focuses the laser beam 504 to output a focussed laser beam 508 which is used to irradiate the surface 104 of the rotor 102 of the MEMS device 100. Due to the retroreflective pattern 114 on the surface 104 of the rotor 102, laser light is reflected from the MEMS device 100 and is captured by the LDV 502.

The system 500 includes a processor 510 which takes raw data relating to reflected light from the LDV 502 and mathematically transforms the data to give in-plane results and other results using trigonometric mathematics.

Using this method, an experimenter can take several measurements by shining the focused laser beam 508 on a plurality of points over the entire surface of the rotor 102 to determine very complex motion profiles of the rotor 102. In this regard, it is also to be noted that the focused laser beam 508 strikes the surface 104 of the rotor 102 of the MEMS device 100 at a 45° angle. To get full movement characteristics of the rotor 102, at least two orientations of the MEMS device 100 relative to the LDV 502 are used.

Figure 6:
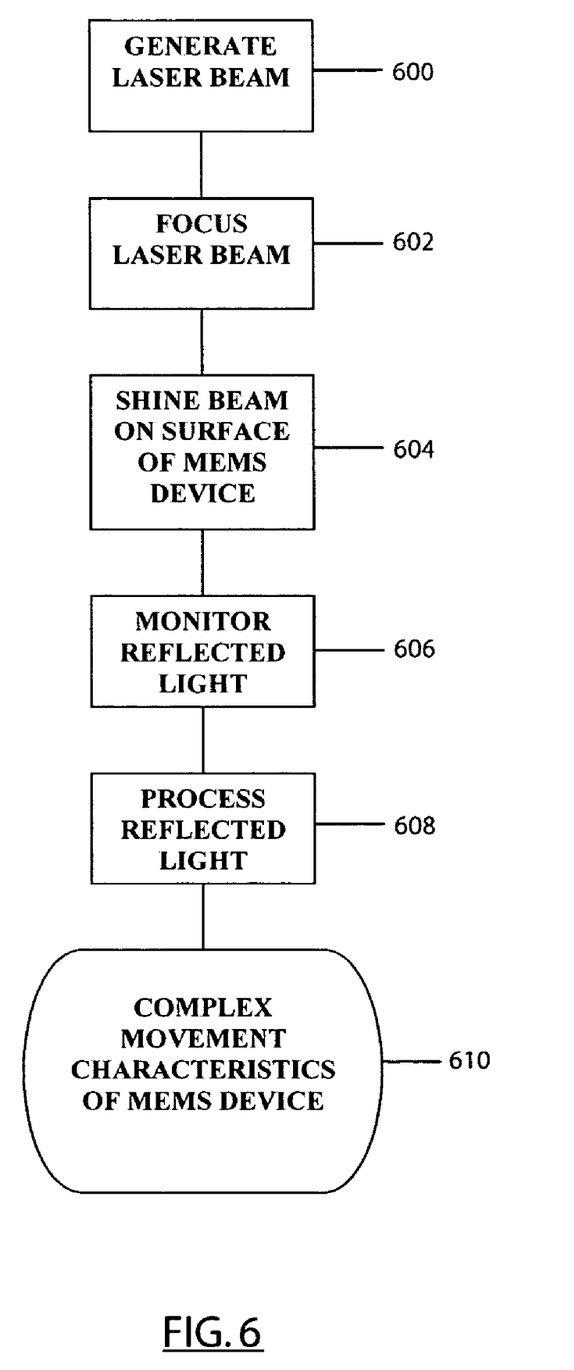
FIG. 6 shows a flowchart of a method, in accordance with an embodiment of the invention, for effecting dynamic measurement of a low mass device.

Finally, referring to FIG. 6 of the drawings, a flowchart of the steps in measuring the movement of the rotor 102 of the MEMS device 100 is shown. Thus, at step 600, a laser beam is generated and the laser beam is focused at step 602. The focused laser beam strikes the surface of the MEMS device 100 to be measured at step 604 and reflected laser light is monitored at step 606. The reflected laser light is processed at step 608 to provide complex movement characteristics of the MEMS device 100 at step 610.

Accordingly, it is an advantage of the invention that a low mass device is provided which is able to have its dynamic characteristics measured in situ including its in-plane movement characteristics. Yet a further advantage of the invention is that a MEMS device is provided which has a retroreflective surface etched therein for facilitating measurement of dynamic characteristics of the MEMS device. A further advantage of the invention is the provision of a system and a method for effecting measurement of dynamic characteristics of low mass devices.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

What is claimed is:

1. A low mass device which comprises:
a body member defining a surface;
a frame to which said body member is moveably mounted such that said body member is displaceable with respect to said frame; and
a retroreflective pattern formed in the surface of the body member wherein the retroreflective pattern is formed by an array of pits etched into the surface of the body member.

2. The device of claim 1 which is in the form of a micro electromechanical device.

3. The device of claim 1 wherein said body member is displaceably mounted in the frame by flexures.

4. The device of claim 1 wherein the low mass device is a data storage device.

5. The device of claim 1 in which each pit is pyramid shaped to reflect light in a plurality of directions.

6. The device of claim 1 further comprising coupling masses coupled to opposite sides of said body member.

7. The device of claim 6 wherein said body member has a square shape with two coupling masses, the two coupling masses being coupled to an opposite sides of said body member.

8. The device of claim 7 further comprising two mounts connecting said body member to said frame, wherein said mounts are disposed on opposite sides of said body member on sides of said body member other than where said coupling masses are disposed.

9. The device of claim 8 further comprising flexures disposed between said body member and said frame at corners of said body member.

10. The device of claim 1 further comprising flexures disposed between said body member and said frame at corners of said body member.

11. A method of fabricating a low mass device, the method Comprising:
providing a body member defining a surface;
moveably mounting said body member to a frame, such that said body member is displaceable with respect to said frame; and
forming a retroreflective pattern in the surface of the body member wherein the retroreflective pattern is formed by an array of pits etched into the surface of the body member.

12. The method of claim 11 which includes forming the body member using photolithography and etching techniques.

13. The method of claim 12 which includes forming the retroreflective pattern in the surface of the body member by an etching technique.

14. The method of claim 13 which includes forming a predetermined pattern in a phatolithography mask, applying the mask to a photoresist applied to the surface of the body member and subjecting the photoresist to a variable curing.

15. The method of claim 14 which includes etching the surface of the body member to form the retroreflective pattern in The body member.

16. The method of claim 14 which includes selecting the pattern of the mask from at least one of a variable density pattern and a gray scale pattern.

17. The method of claim 11 further comprising forming each of said pits with a pyramid shape to reflect light in a plurality of directions.

18. The method of claim 11 further comprising forming said body member with a square shape.

19. The method of claim 18 further comprising forming two mounts between said body member and said frame and attaching two coupling masses to said body member,
wherein each of said mounts and coupling masses is disposed on a different side of said square body member.

20. The method of claim 18 further comprising forming flexures between said body member and said frame at corners of said body member.

* * * * *

UNITED STATES PATENT AND TRADEMARK OFFICE
CERTIFICATE OF CORRECTION

| | | |
|---|---|---|
| PATENT NO. | : 7,448,273 B2 | Page 1 of 1 |
| APPLICATION NO. | : 10/990178 | |
| DATED | : November 11, 2008 | |
| INVENTOR(S) | : Thomas W. Ives | |

It is certified that error appears in the above-identified patent and that said Letters Patent is hereby corrected as shown below:

In column 4, line 26, in Claim 11, delete "thc" and insert -- the --, therefor.

In column 4, line 27, in Claim 11, delete "Comprising" and insert -- comprising --, therefor.

In column 4, line 44, in Claim 14, delete "phatolithography" and insert -- photolithography --, therefor.

In column 4, line 49, in Claim 15, delete "The" and insert -- the --, therefor.

Signed and Sealed this

Twenty-third Day of June, 2009

JOHN DOLL
*Acting Director of the United States Patent and Trademark Office*